(12) United States Patent
Gabor et al.

(10) Patent No.: US 12,724,353 B2
(45) Date of Patent: Sep. 1, 2026

(54) OPTIMAL SCANNER MAPS AND FIELD LAYOUTS

(71) Applicant: International Business Machines Corporation, Armonk, NY (US)

(72) Inventors: Allen Gabor, Katonah, NY (US); Richard C. Johnson, Selkirk, NY (US); Romain Lallement, Troy, NY (US); Daniel Schmidt, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 18/187,309

(22) Filed: Mar. 21, 2023

(65) Prior Publication Data

US 2024/0319579 A1 Sep. 26, 2024

(51) Int. Cl.
*G03F 7/00* (2006.01)

(52) U.S. Cl.
CPC ...... *G03F 7/70425* (2013.01); *G03F 7/70058* (2013.01); *G03F 7/70433* (2013.01); *G03F 7/70475* (2013.01)

(58) Field of Classification Search
CPC .... G03F 1/36; G03F 7/70058; G03F 7/70358; G03F 7/70725; G03F 9/70; G03F 1/44; G03F 7/2004; G03F 7/2039; G03F 7/70008; G03F 7/7015; G03F 7/70208; G03F 7/70241; G03F 7/70275; G03F 7/70341; G03F 7/70458; G03F 7/70483; G03F 7/705; G03F 7/70516; G03F 7/70525; G03F 7/706; G03F 7/70616; G03F 7/70633; G03F 7/70641; G03F 7/70716; G03F 7/70775; G03F 9/7003; G03F 9/7026; G03F 9/7034; G03F 9/7076; G03F 7/70433; G03F 7/7045; G03F 7/70466; G03F 7/70325; G03F 7/7025; G03F 7/703;

(Continued)

(56) References Cited

U.S. PATENT DOCUMENTS

| | | |
|---|---|---|
| 5,751,403 A | 5/1998 | Mizutani et al. |
| 5,841,520 A | 11/1998 | Taniguchi |

(Continued)

OTHER PUBLICATIONS van Schoot et al., "High-numerical aperture extreme ultraviolet scanner for 8-nm lithography and beyond," published Dec. 2017. (Year: 2017).*

(Continued)

*Primary Examiner* — Christina A Riddle
(74) *Attorney, Agent, or Firm* — CANTOR COLBURN LLP; Samuel Waldbaum

(57) ABSTRACT

A photographic lithography method for printing chip sections of a mask to a wafer is provided. The method includes generating the mask including a pattern of rows of the chip sections, each alternating row including half-fields mirrored with respect to corresponding half-fields of an adjacent row, exposing every other row of half-fields with the pattern and the wafer in a first relative orientation based on mirroring of the half-fields and the corresponding half-fields, re-orienting the pattern and the wafer to have a second relative orientation opposite the first relative orientation and exposing remaining rows of the half-fields with the pattern and the wafer in the second relative orientation.

20 Claims, 7 Drawing Sheets

(58) Field of Classification Search
CPC ............. G03F 7/70266; G03F 7/70258; G03F 7/70283; G03F 7/707; G03F 7/70691; G03F 7/70758; G03F 7/70308; G03F 7/70825; G03F 7/70425–70475; H01L 21/0273; H01L 21/67259; H01L 21/682; H01L 21/76816; H01L 22/12; H01L 22/20
USPC .... 355/18, 30, 46, 52–55, 66–77; 430/5, 22, 430/312
See application file for complete search history.

(56) References Cited

U.S. PATENT DOCUMENTS

| | | | | |
|---|---|---|---|---|
| 7,261,983 | B2 | 8/2007 | Smith et al. | |
| 7,446,853 | B2 | 11/2008 | Fukuhara et al. | |
| 9,810,994 | B2 | 11/2017 | Lin et al. | |
| 10,209,636 | B1 | 2/2019 | Toda et al. | |
| 2005/0134820 | A1* | 6/2005 | Mulder | G03F 7/701 355/77 |
| 2007/0013890 | A1* | 1/2007 | Loopstra | G03F 7/70466 355/53 |
| 2007/0181825 | A1* | 8/2007 | Yoshikawa | G03F 7/70616 250/491.1 |
| 2007/0263190 | A1* | 11/2007 | De Boeij | G03F 7/70425 355/75 |
| 2009/0226677 | A1* | 9/2009 | Pici | G03F 7/70366 355/53 |

OTHER PUBLICATIONS

Gabor et al., "Effect of high NA "half-field" printing on overlay error," https://doi.org/10.1117/12.2581823, Extreme Ultraviolet (EUV) Lithography XII, 1160907 (Mar. 9, 2021); 3 Pages.
Lallement et al., "OVL performance of HighNA stitched fields using Monte Carlo simulation." https://spie.org/advanced-lithography/presentation/OVL-performance-of-HighNA-stitched-fields-using-Monte-Carlo-simulations/12051-49, Jun. 13, 2022. 3 Pages.
Schoot et al., "High-numerical aperture extreme ultraviolet scanner for 8-nm lithography and beyond," https://doi.org/10.1117/1.JMM.16.4.041010. MEMS MOEMS 16(4) 041010 (Oct. 30, 2017) 3 Pages.

* cited by examiner

OPTIMAL SCANNER MAPS AND FIELD LAYOUTS

BACKGROUND

The present invention generally relates to fabrication methods and resulting structures for semiconductor devices. More specifically, the present invention relates to optimal scanner maps and field layouts when using both full-field and half-field exposure tools.

Photolithography is a well-known process for transferring geometric shapes present on a photomask onto a resist layer over a substrate. In lithographic processing, a photosensitive polymer film called photoresist is normally applied over a substrate and then allowed to dry. An exposure tool is utilized to expose the wafer with the proper geometrical patterns through a mask by means of a source of light or radiation. After exposure, the wafer is treated to develop the mask images transferred to the photosensitive material. These masking patterns are then used to create the device features of the circuit.

SUMMARY

Embodiments of the present invention are directed to a photographic lithography method for printing chip sections of a mask to a wafer. A non-limiting example of the photographic lithography method includes generating the mask including a pattern of rows of the chip sections, each alternating row including half-fields mirrored with respect to corresponding half-fields of an adjacent row, exposing every other row of half-fields with the pattern and the wafer in a first relative orientation based on mirroring of the half-fields and the corresponding half-fields, re-orienting the pattern and the wafer to have a second relative orientation opposite the first relative orientation and exposing remaining rows of the half-fields with the pattern and the wafer in the second relative orientation.

By an execution of the photographic lithography method, a photographic lithography tool having a numerical aperture of 0.55 NA can be used to expose and process half-fields of chip sections of a mask for processing of a wafer.

In accordance with additional or alternative embodiments, the photographic lithography method further includes processing the wafer in accordance with the exposing, exposing a full field map of the wafer in association with the first relative orientation and repeating the photographic lithography method for a next lithographic elevation and using chip layout alignment marks in the full field map for alignment.

In accordance with additional or alternative embodiments, the half-fields are about 16.5 mm×26 mm.

In accordance with additional or alternative embodiments, the re-orienting includes rotating the wafer, rotating the pattern, generating a second mask with a mirrored pattern, which is mirrored relative to the pattern, and replacing the mask with the second mask and optically rotating the pattern.

Embodiments of the present invention are directed to a photographic lithography apparatus. A non-limiting example of the photographic lithography apparatus includes a surface supportive of the mask including a pattern of rows of chip sections, each alternating row including half-fields mirrored with respect to corresponding half-fields of an adjacent row, a chuck supportive of the wafer, optics optically interposed between the surface and the chuck, a light source to expose the pattern onto the wafer via the optics and a controller. The controller controls operations of the surface, the chuck and the light source to expose every other row of half-fields with the pattern and the wafer in a first relative orientation based on mirroring of the half-fields and the corresponding half-fields, re-orient the pattern and the wafer to have a second relative orientation opposite the first relative orientation and expose remaining rows of the half-fields with the pattern and the wafer in the second relative orientation.

Use of the photographic lithography apparatus allows for exposure and processing of half-fields of chip sections of a mask for processing of a wafer.

In accordance with additional or alternative embodiments, the half-fields are about 16.5 mm×26 mm.

In accordance with additional or alternative embodiments, the controller re-orients the pattern and the wafer by rotating one of the chuck or the surface.

In accordance with additional or alternative embodiments, a second mask with a second pattern, which is rotated relative to the pattern, is provided and the controller effectively re-orients the pattern and the wafer by replacing the mask with the second mask.

In accordance with additional or alternative embodiments, additional optics are provided the controller re-orients the pattern and the wafer by inserting the additional optics into a light path of the optics to optically rotate the pattern.

Embodiments of the invention are directed to a photographic lithography method for printing chip sections of a mask to a wafer. A non-limiting example of the photographic lithography method includes generating the mask including a pattern of rows and columns of the chip sections, each alternating row and column including partial-fields mirrored with respect to corresponding partial-fields of an adjacent row and column, exposing every other row and column of partial-fields with the pattern and the wafer in a first relative orientation based on mirroring of the partial-fields and the corresponding partial-fields, re-orienting the pattern and the wafer to have a second relative orientation opposite the first relative orientation and exposing remaining rows and columns of the partial-fields with the pattern and the wafer in the next relative orientation.

By an execution of the photographic lithography method, a photographic lithography tool having a numerical aperture of 0.55 NA can be used to expose and process partial-fields of chip sections of a mask for processing of a wafer.

In accordance with additional or alternative embodiments, the photographic lithography method further includes processing the wafer in accordance with the exposing, exposing a full field map of the wafer in association with the first relative orientation and repeating the photographic lithography method for a next lithographic elevation and using chip layout alignment marks in the full field map for alignment.

In accordance with additional or alternative embodiments, the re-orienting includes rotating the wafer, rotating the pattern, generating a second mask with a mirrored pattern, which is mirrored relative to the pattern, and replacing the mask with the second mask and optically rotating the pattern.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, lithographic apparatus is a machine that applies a desired pattern onto a target portion of a substrate. A lithographic apparatus can be used, for example, in the manufacture of Ics. In that circumstance, a patterning device (or patterning structure), which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam while synchronously scanning the substrate parallel or anti-parallel to this direction.

Figure 1:
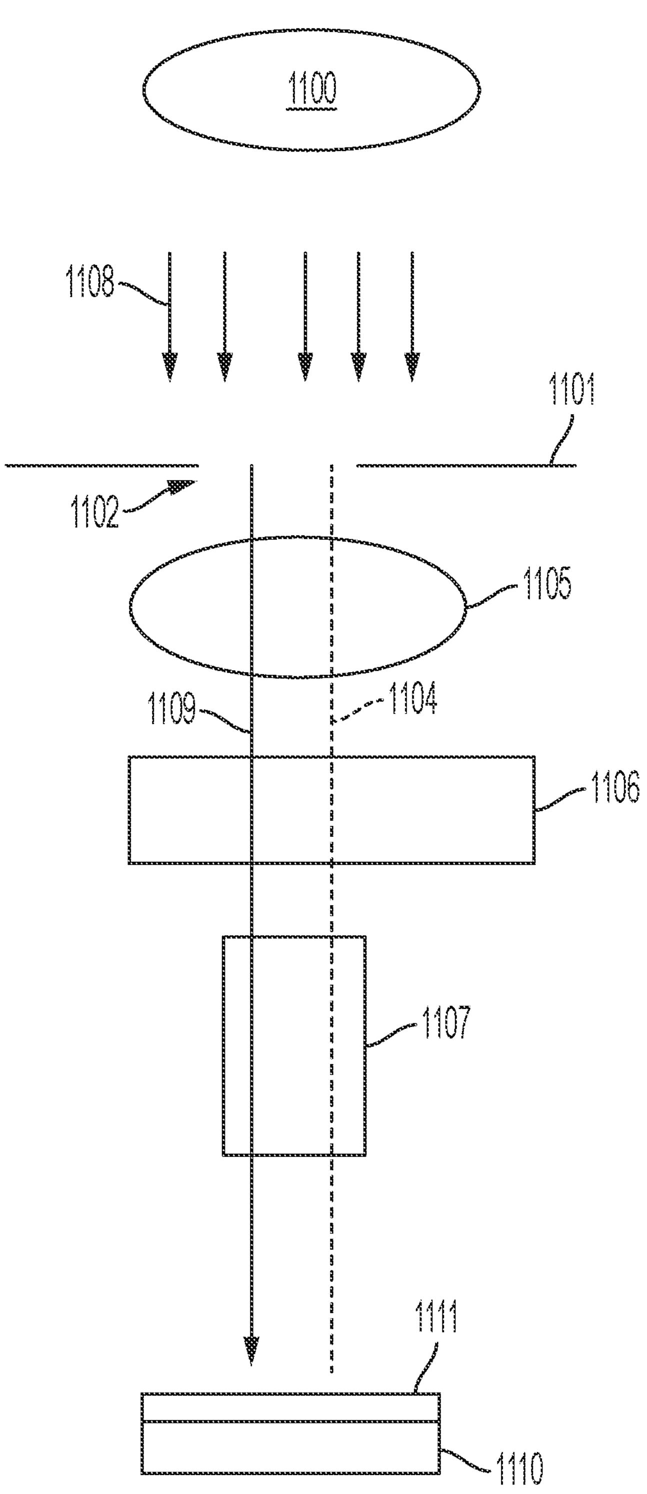
FIG. 1 is a schematic illustration of a conventional photographic lithography tool.

A simplified diagram of an exposure tool is shown in FIG. 1. As can be seen, light source 1100 projects light waves 1108 through opening 1102 in aperture stop 1101. Opening 1102 is commonly referred to as the aperture or pupil of the aperture stop. Condenser lens 1105 collects the light from the opening 1102 and focuses it on mask 1106 such that the mask 1106 is evenly illuminated. When illuminating beam 1103 passes through mask 1106, imaging beam 1109 is generated. Imaging beam 1109 is projected through projection lens 1107 such that the image of the pattern on the mask 1106 is focused onto the resist 1111 over the substrate or wafer 1110. As can be seen in FIG. 1, the opening 1102 is situated in the center of aperture stop 1101. Because of this, illuminating beam 1103 is projected along the optical axis (dashed line 1104) from the opening 1102 to condenser lens 1105 and mask 1106.

One of the goals in integrated circuit fabrication is to faithfully reproduce the original design on the substrate (via the mask). As the demand to image smaller and smaller features in the semiconductor manufacturing process has continued unabated, the limitations of optical lithography that were once accepted have been exceeded repeatedly. A theoretical estimate of the limits of pattern printing can be given by the Rayleigh criterion for resolution R as shown in equation (a):

$$R = k_1 * \lambda NA \tag{a}$$

where λ is the wavelength of the radiation used, NA is the numerical aperture of the projection system and k1 is a Rayleigh constant (process dependent adjustment factor). It follows from equation (a) that the resolution can be improved in three ways: by shortening the exposure wavelength A, by increasing the numerical aperture NA or by decreasing the value of k1.

Figure 2:
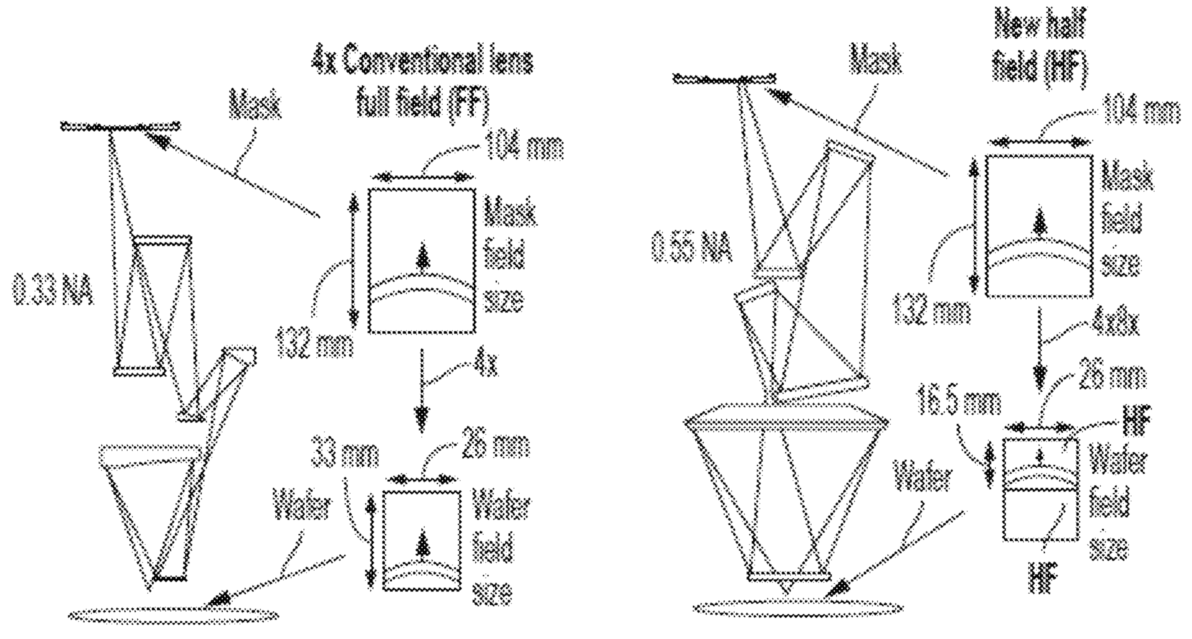
FIG. 2 is a side view of a conventional extreme ultraviolet lithography exposure tool with a numerical aperture of 0.33 NA and its full-field exposures in comparison with a next generation photolithographic extreme ultraviolet exposure tool with a numerical aperture of 0.55 NA and its half-field exposures in accordance with one or more embodiments of the present invention.

With reference to FIG. 2, while conventional extreme ultraviolet lithography exposure tools use a 0.33 NA, next generation extreme ultraviolet exposure tools will have a 0.55 NA. This has the result of increasing resolution and print half-field images. This leads to a requirement for exposure tool control methods that take into account half-field printing.

Turning now to an overview of the aspects of the invention, one or more embodiments of the invention address the above-described shortcomings of the prior art by providing for a photographic lithography method for printing chip sections of a mask to a wafer using a photographic lithography tool having a numerical aperture of 0.55 NA or higher. The photographic lithography method includes generating the mask to include a pattern of rows of the chip sections, where each alternating row includes half-fields mirrored with respect to corresponding half-fields of an adjacent row. The photographic lithography method further includes exposing every other row of half-fields with the pattern and the wafer in a first relative orientation based on mirroring of the half-fields and the corresponding half-fields, re-orienting the pattern and the wafer to have a second relative orientation opposite the first relative orientation and exposing remaining rows of the half-fields with the pattern and the wafer in the second relative orientation.

The above-described aspects of the invention address the shortcomings of the prior art by providing for design layouts and methods to achieve a layout for chips with size equal to or less than half-field exposure even where a chip size is equal to that of a full-field exposure, assuming the chip is mirrored across a stitch region.

Figure 3:
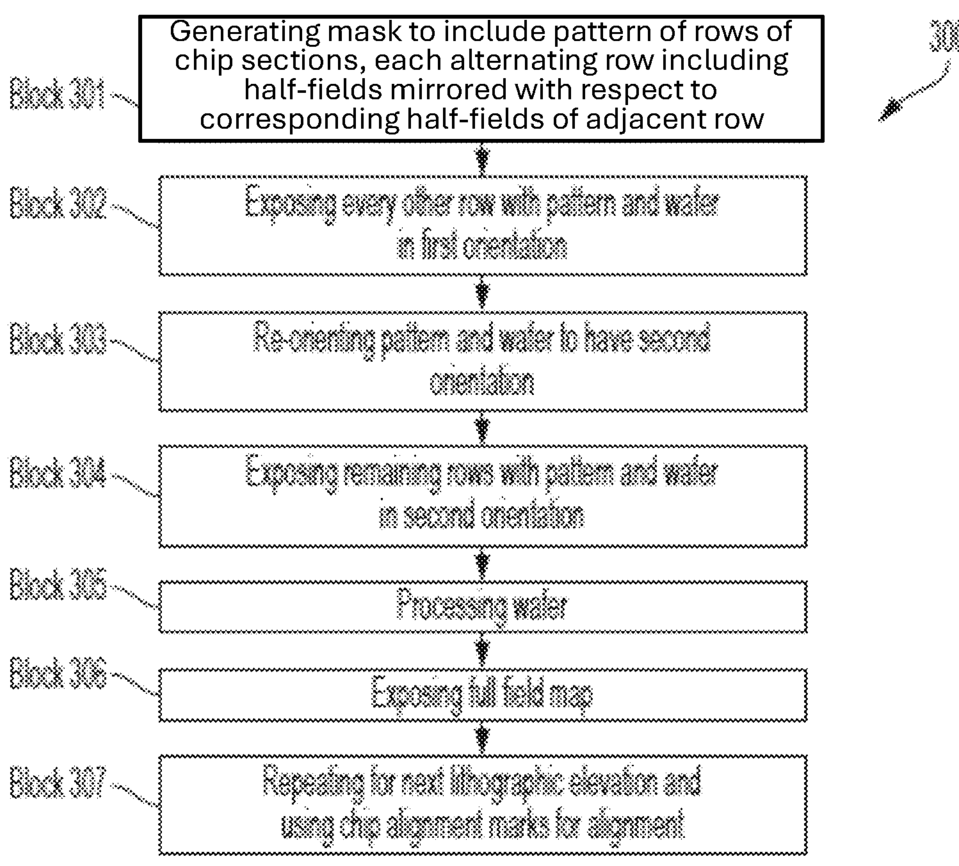
FIG. 3 is a flow diagram illustrating a photographic lithography method for printing chip sections of a mask to a wafer in accordance with one or more embodiments of the present invention.
Figure 4:
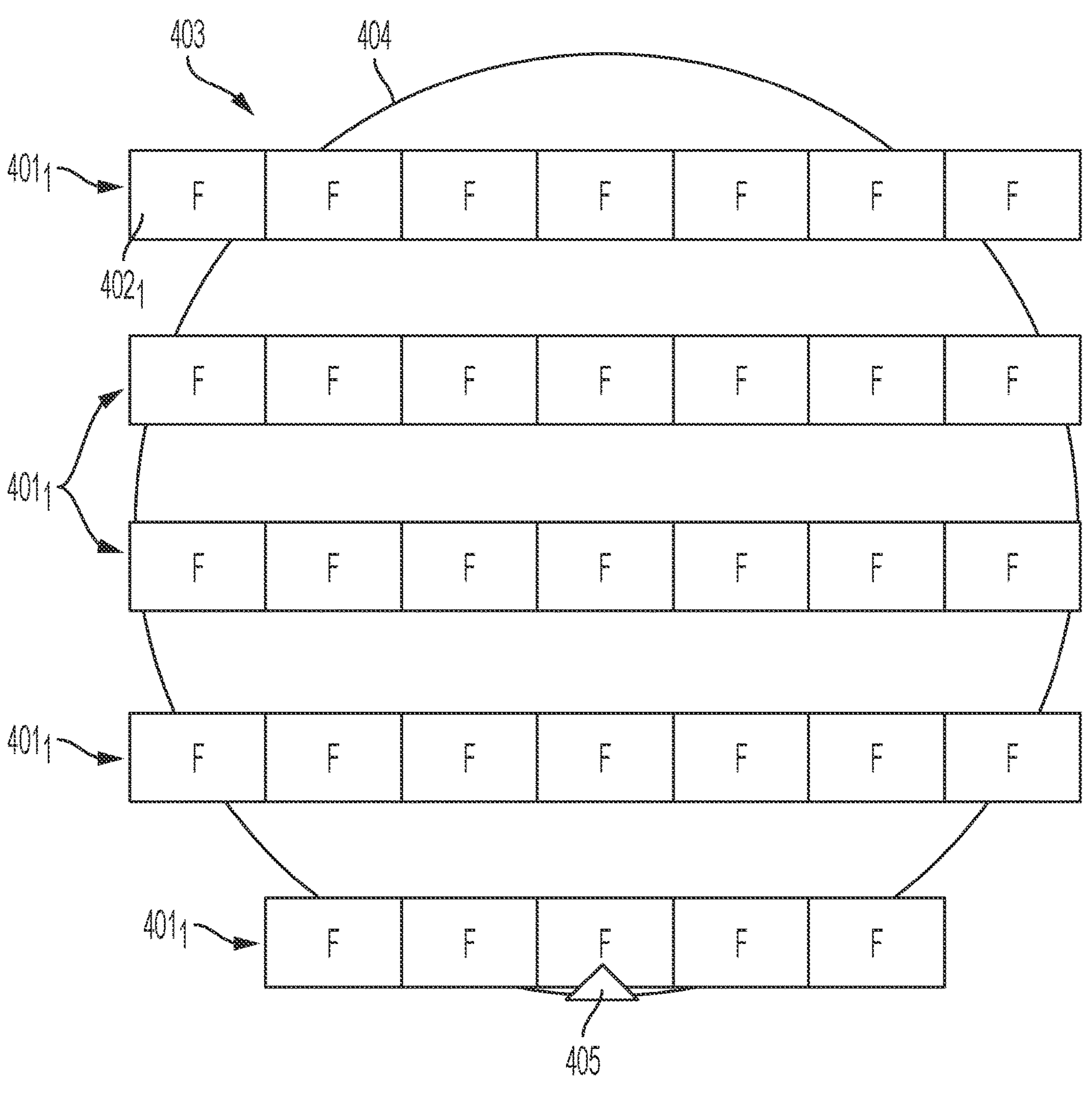
FIG. 4 is a schematic diagram illustrating an exposure of alternating rows of half-fields in accordance with one or more embodiments of the present invention.
Figure 5:
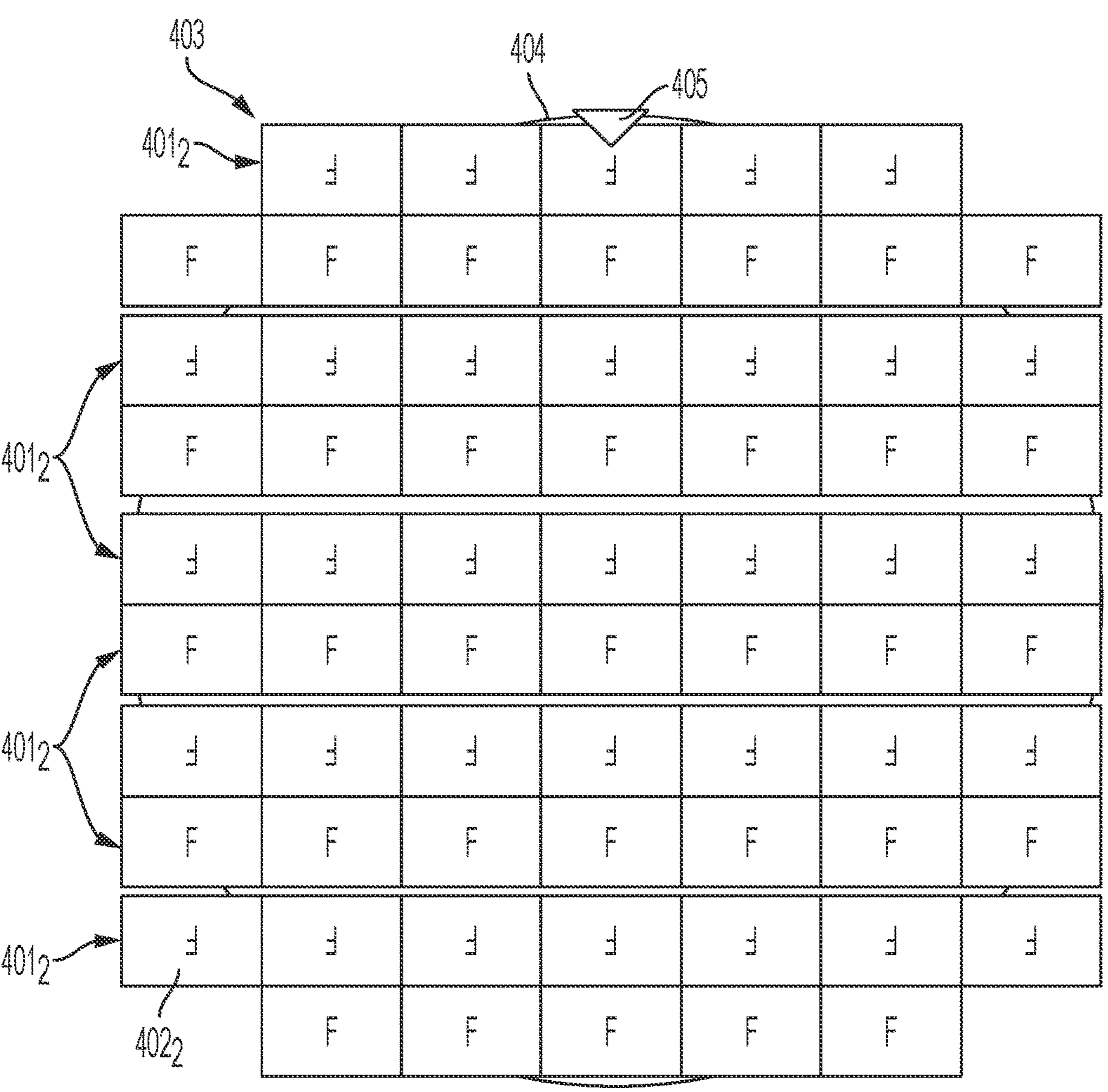
FIG. 5 is a schematic diagram illustrating an exposure of remaining rows of half-fields in accordance with one or more embodiments of the present invention.
Figure 6:
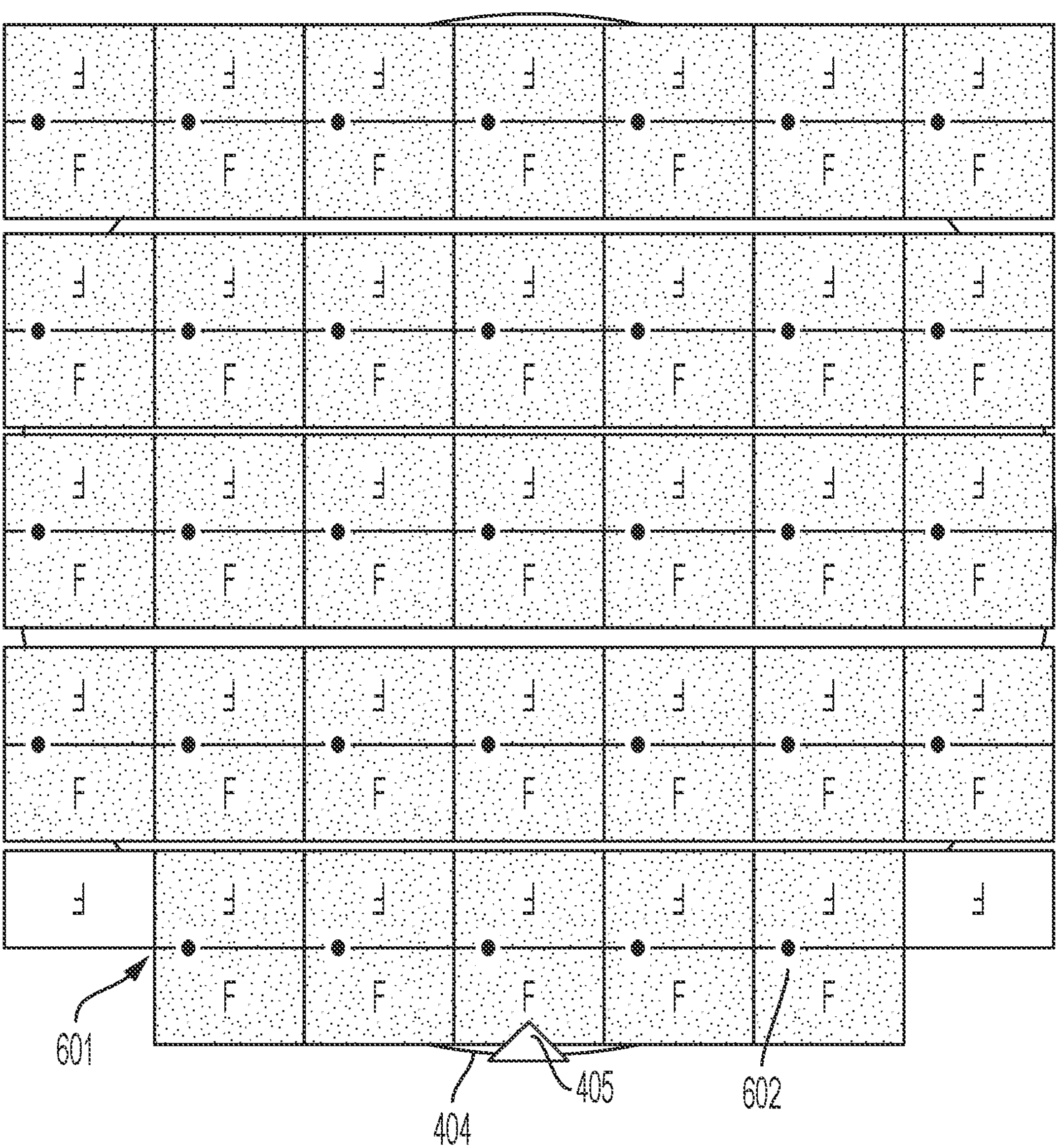
FIG. 6 is a schematic diagram illustrating a processing of a wafer and an exposure of a full field map in accordance with one or more embodiments of the present invention.

Turning now to a more detailed description of aspects of the present invention, FIG. 3 is a flow diagram illustrating a photographic lithography method 300 for printing chip sections of a mask to a wafer using a photographic lithography tool having a numerical aperture of 0.55 or greater. As shown in FIG. 3, the photographic lithography method 300 includes generating the mask to include a pattern of rows of the chip sections, where each alternating row includes half-fields mirrored with respect to corresponding half-fields of an adjacent row (block 301). The half-fields are each about 16.5 mm×26 mm in size as compared to the size of the full field chip sections (i.e., 132 mm×104 mm). The half-fields can include half-fields F and half-fields reversed F that are vertically mirrored (see FIGS. 4 and 5). The photographic lithography method 300 further includes exposing every other row of half-fields with the pattern and the wafer in a first relative orientation based on mirroring of the half-fields and the corresponding half-fields (block 302), re-orienting the pattern or the wafer to have a second relative orientation opposite the first relative orientation (block 303) and exposing remaining rows of the half-fields with the pattern and the wafer in the second relative orientation (block 304). In addition, the photographic lithography method 300 also includes processing the wafer in accordance with the exposing (block 305), exposing a full field map of the wafer in association with the first relative orientation (block 306) and repeating the method for a next lithographic elevation and using chip layout alignment marks in the full field map for alignment (block 307). The re-orienting of the pattern and the wafer of block 303 can be achieved by rotating the wafer, rotating the pattern, generating a second mask with a mirrored pattern, which is mirrored relative to the pattern, and replacing the mask with the second mask to effectively rotate the pattern and optically rotating the pattern With reference to FIGS. 4, 5 and 6, the photographic lithography method 300 of FIG. 3 is illustrated graphically. Initially, the mask is generated to include a pattern 403 of rows $401_1$/$401_2$ of chip sections, where each alternating row $401_1$ includes half-fields $402_1$ that are each mirrored with respect to corresponding half-fields $402_2$ of an adjacent row $401_2$. As shown in FIG. 4, every other row $401_1$ of half-fields $402_1$ is exposed with the pattern 403 and the wafer 404 in a first relative orientation. Similarly, as shown in FIG. 5, the remaining rows $401_2$ of half-fields $402_2$ are exposed with the pattern 403 and the wafer 404 in a second relative orientation. The first relative orientation of FIG. 4 can be referred to as notch-down, as evidenced by the position of the notch 405 of the wafer 404 in FIG. 4. Likewise, the second relative orientation of the pattern 403 relative to the wafer 404 could be referred to as notch-up, as evidenced by the position of the notch 405 in FIG. 5. Thus, it is seen that the first and second relative positions of the pattern 403 and the wafer 404 are opposite one another and based on the mirroring of the half-fields $402_1$ and the corresponding half-fields $402_2$. Once every other row $401_1$ of half-fields $402_1$ and the remaining rows $401_2$ of half-fields $402_2$ are exposed, the wafer 404 is processed. At this point, the full field map 601 of the wafer 404 can be exposed in association with the first relative orientation (i.e., the notch-down orientation) and the photographic lithography method for a next lithographic elevation of the chip sections can be repeated using chip layout alignment marks 602 in the full field map for alignment.

Figure 7:
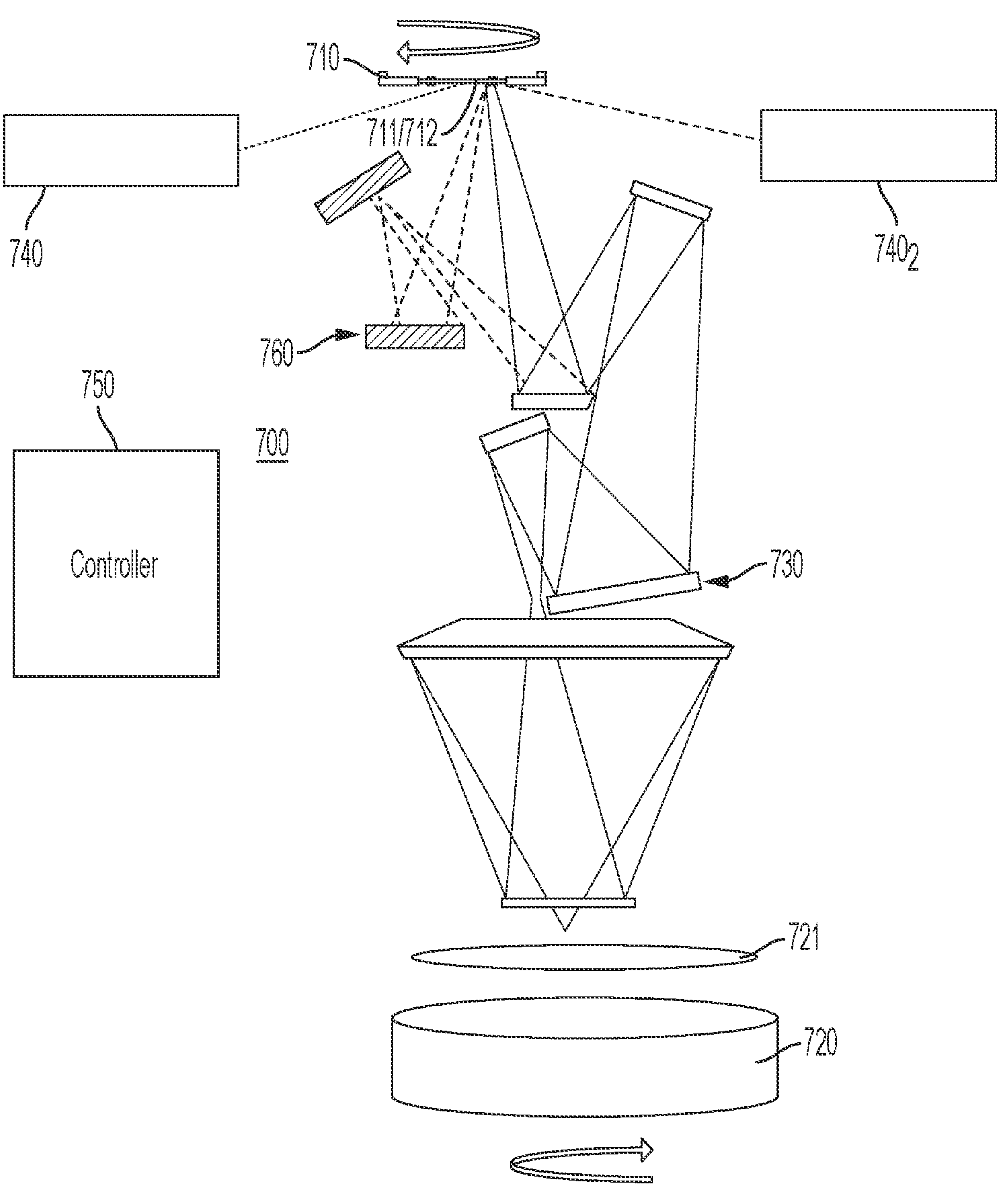
FIG. 7 is a side schematic view of a photographic lithography apparatus in accordance with one or more embodiments of the present invention.

With reference to FIG. 7, a photographic lithography apparatus 700 is provided for executing at least the photographic lithography method 300 of FIG. 3. The photographic lithography apparatus 700 includes a mask surface 710, which is supportive of a mask 711, where the mask 711 includes a pattern of rows of chip sections and each alternating row includes half-fields that are about 16.5 mm×26 mm and that are mirrored with respect to corresponding half-fields of an adjacent row (see FIGS. 4 and 5). The photographic lithography apparatus 700 further includes a wafer chuck 720, which is supportive of the wafer 721, a series of optical elements 730 that is optically interposed between the surface mask surface 710 and the wafer chuck 720, a light source 740 to expose the pattern of the mask 711 onto the wafer 721 via the series of optical elements 730 and a controller 750. The controller is disposed in signal communication with the mask surface 710, the wafer chuck 720 and the light source 740 and with servos thereof and is configured to control operations of the mask surface 710, the wafer chuck 720 and the light source 740. The controller 750 can thus cause every other row of half-fields to be exposed with the pattern and the wafer 721 in a first relative orientation based on mirroring of the half-fields and the corresponding half-fields. The controller 750 can also re-orient the pattern and the wafer 721 to have a second relative orientation opposite the first relative orientation and expose remaining rows of the half-fields with the pattern and the wafer 721 in the second relative orientation.

The controller 750 can re-orient the pattern and the wafer 721 by rotating one of the wafer chuck 720 or the mask surface 710. Alternatively, there can be a second mask 712 with a second pattern, which is rotated relative to the pattern. In these or other cases, the controller 750 effectively re-orients the pattern and the wafer 721 by replacing the mask 711 with the second mask 712. As another alternative, there can be additional optical elements 760 (and an additional light source 740). In these or other cases, the controller 750 can re-orient the pattern and the wafer 721 by inserting the additional optical elements 760 into a light path of the series of optical elements 730 (along with activation the additional light source $740_2$) to optically rotate the pattern.

Figure 8:
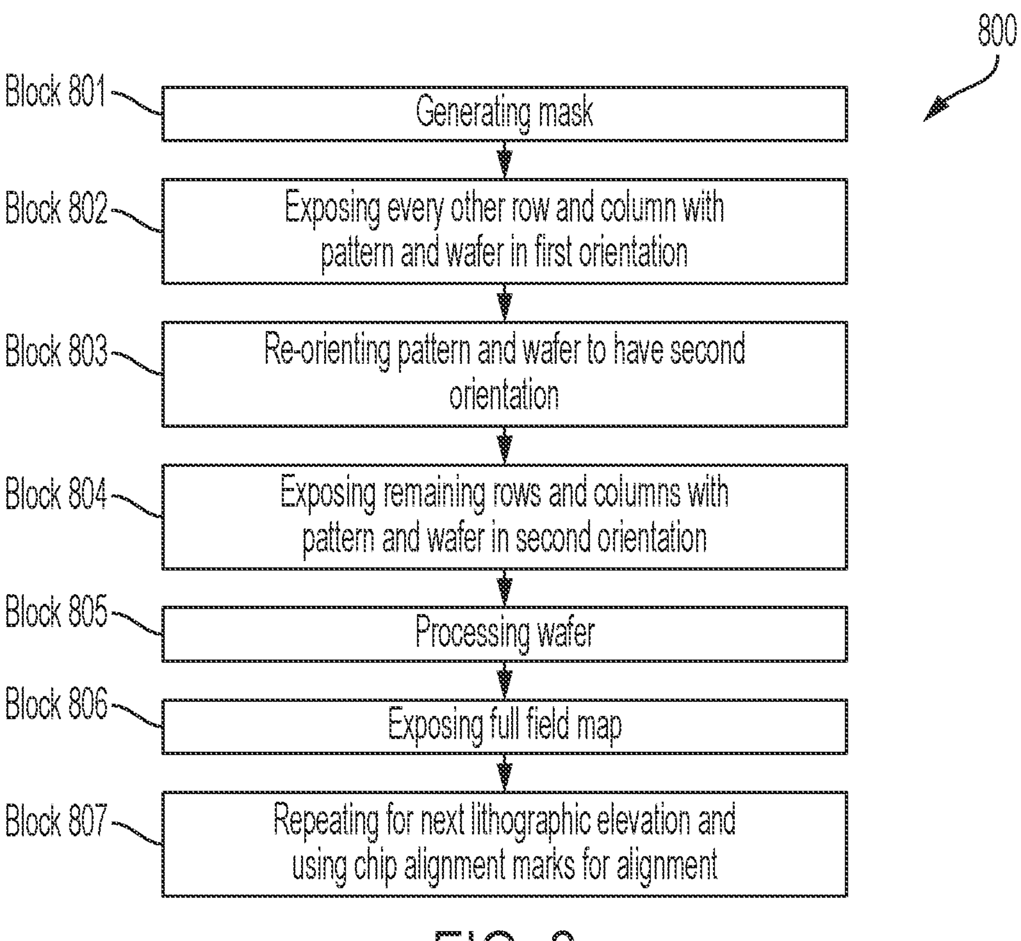
FIG. 8 is a flow diagram illustrating a photographic lithography method for printing chip sections of a mask to a wafer in accordance with one or more further embodiments of the present invention.
Figure 9:
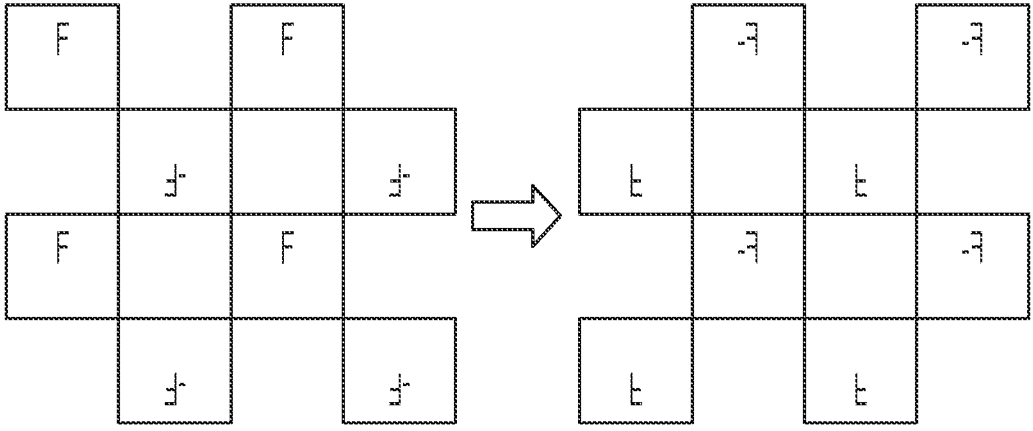
FIG. 9 is a schematic diagram of an exposure of rows and columns of partial-fields and a subsequent exposure of remaining rows and columns of partial fields in accordance with one or more further embodiments of the present invention.

With reference to FIGS. 8 and 9, a photographic lithography method 800 is provided for printing chip sections of a mask to a wafer using a photographic lithography tool having a numerical aperture of 0.55 or greater. FIG. 8 is a flow diagram illustrating the photographic lithography method 800. FIG. 9 is a schematic diagram illustrating an arrangement of partial-fields.

As shown in FIG. 8, the photographic lithography method 800 includes generating the mask to include a pattern of rows and columns of the chip sections, where each alternating row and column includes partial-fields (i.e., quarter-fields) that are mirrored in multiple axes with respect to corresponding partial-fields of adjacent rows and columns (block 801). The photographic lithography method 800 further includes exposing every other row and column of partial-fields with the pattern and the wafer in a first relative orientation based on multi-axis mirroring of the partial-fields and the corresponding partial-fields (block 802). As shown in FIG. 9, the partial-fields can include partial-fields F, partial-fields F, partial-fields reversed F and partial-fields reversed F, where partial-fields F and partial-fields F are horizontally mirrored, partial-fields F and partial-fields reversed F are vertically mirrored, partial-fields F and partial-fields reversed F are vertically mirrored and partial-fields reversed F and partial-fields reversed F are horizontally mirrored. The photographic lithography method 800 further includes re-orienting the pattern and the wafer to have a second relative orientation opposite the first relative orientation (block 803) and exposing remaining rows and columns of the partial-fields with the pattern and the wafer in the second relative orientation (block 804). In addition, the photographic lithography method 800 also includes processing the wafer in accordance with the exposing (block 805), exposing a full field map of the wafer in association with the first relative orientation (block 806) and repeating the method for a next lithographic elevation and using chip layout alignment marks in the full field map for alignment (block 807). The re-orienting of the pattern and the wafer of block 803 can be achieved by rotating the wafer, rotating the pattern, generating a second mask with a mirrored pattern, which is mirrored relative to the pattern, and replacing the mask with the second mask to effectively rotate the pattern and optically rotating the pattern.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a 11001 orientated crystalline surface can take on a 11001 orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A photographic lithography method for printing chip sections of a mask to a wafer, the method comprising:

generating the mask comprising a pattern of rows of the chip sections, each alternating row comprising half-fields mirrored with respect to corresponding half-fields of an adjacent row;

exposing every other row of half-fields with the pattern and the wafer in a first relative orientation based on mirroring of the half-fields and the corresponding half-fields;

re-orienting the pattern and the wafer to have a second relative orientation opposite the first relative orientation; and exposing remaining rows of the half-fields with the pattern and the wafer in the second relative orientation, wherein:

the half-fields of each alternating row and each of the corresponding half-fields of the adjacent row share a common edge, and the half-fields of each alternating row are each mirrored with respect to each of the corresponding half-fields of the adjacent row about first and second perpendicular axes.

2. The photographic lithography method according to claim 1, further comprising:

processing the wafer in accordance with the exposing; and exposing a full field map of the wafer in association with the first relative orientation.

3. The photographic lithography method according to claim 2, repeating the photographic lithography method for a next lithographic elevation and using chip layout alignment marks in the full field map for alignment, wherein:

each chip layout alignment mark is disposed between each of the half-fields of each alternating row and the corresponding half-field of the adjacent row, and each alignment mark is offset from at least one of the first and second axis.

4. The photographic lithography method according to claim 1, wherein the half-fields are about 16.5 mm×26 mm.

5. The photographic lithography method according to claim 1, wherein the re-orienting comprising rotating the wafer.

6. The photographic lithography method according to claim 1, wherein the re-orienting comprises rotating the pattern.

7. The photographic lithography method according to claim 1, wherein the re-orienting comprises:

generating a second mask with a mirrored pattern, which is mirrored relative to the pattern; and replacing the mask with the second mask.

8. The photographic lithography method according to claim 1, wherein the re-orienting comprises optically rotating the pattern.

9. A photographic lithography apparatus, comprising:

a surface supportive of a mask comprising a pattern of rows of chip sections, each alternating row comprising half-fields mirrored with respect to corresponding half-fields of an adjacent row;

a chuck supportive of a wafer;

optics optically interposed between the surface and the chuck;

a light source to expose the pattern onto the wafer via the optics; and a controller to control operations of the surface, the chuck and the light source to:

expose every other row of half-fields with the pattern and the wafer in a first relative orientation based on mirroring of the half-fields and the corresponding half-fields;

re-orient the pattern and the wafer to have a second relative orientation opposite the first relative orientation; and expose remaining rows of the half-fields with the pattern and the wafer in the second relative orientation, wherein:

the half-fields of each alternating row and each of the corresponding half-fields of the adjacent row share a common edge, and the half-fields of each alternating row are each mirrored with respect to each of the corresponding half-fields of the adjacent row about first and second perpendicular axes.

10. The photographic lithography apparatus according to claim 9, wherein the half-fields are about 16.5 mm×26 mm.

11. The photographic lithography apparatus according to claim 9, wherein the controller re-orients the pattern and the wafer by rotating one of the chuck or the surface.

12. The photographic lithography apparatus according to claim 9, further comprising a second mask with a second pattern, which is rotated relative to the pattern, and wherein the controller effectively re-orients the pattern and the wafer by replacing the mask with the second mask.

13. The photographic lithography apparatus according to claim 9, further comprising additional optics, wherein the controller re-orients the pattern and the wafer by inserting the additional optics into a light path of the optics to optically rotate the pattern.

14. A photographic lithography method for printing chip sections of a mask to a wafer, the method comprising:

generating the mask comprising a pattern of rows and columns of the chip sections, each alternating row and column comprising partial-fields mirrored with respect to corresponding partial-fields of an adjacent row and column;

exposing every other row and column of partial-fields with the pattern and with the wafer in a first relative orientation based on mirroring of the partial-fields and the corresponding partial-fields;

re-orienting the pattern and the wafer to have a second relative orientation opposite the first relative orientation; and exposing remaining rows and columns of the partial-fields with the pattern and with the wafer in the second relative orientation, wherein:

the half-fields of each alternating row and each of the corresponding half-fields of the adjacent row share a common edge, and the partial-fields of each alternating row and column are each mirrored with respect to each of the corresponding partial-fields of the adjacent row and column about first and second perpendicular axes.

15. The photographic lithography method according to claim 14, further comprising:

processing the wafer in accordance with the exposing; and exposing a full field map of the wafer in association with the first relative orientation.

16. The photographic lithography method according to claim 15, repeating the photographic lithography method for a next lithographic elevation and using chip layout alignment marks in the full field map for alignment.

17. The photographic lithography method according to claim 14, wherein the re-orienting comprising rotating the wafer.

18. The photographic lithography method according to claim 14, wherein the re-orienting comprises rotating the pattern.

19. The photographic lithography method according to claim 14, wherein the re-orienting comprises:

generating a second mask with a mirrored pattern; and replacing the mask with the second mask.

20. The photographic lithography method according to claim 14, wherein the re-orienting comprises optically rotating the pattern.

* * * * *